United States Patent
Yoo et al.

(10) Patent No.: US 10,903,363 B2
(45) Date of Patent: Jan. 26, 2021

(54) FERROELECTRIC SEMICONDUCTOR DEVICE

(71) Applicant: SK hynix Inc., Icheon-si (KR)

(72) Inventors: Hyangkeun Yoo, Icheon-si (KR); Yong Soo Choi, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/231,255

(22) Filed: Dec. 21, 2018

(65) Prior Publication Data

US 2019/0393355 A1    Dec. 26, 2019

(30) Foreign Application Priority Data

Jun. 22, 2018 (KR) ........................ 10-2018-0072331

(51) Int. Cl.
| | | |
|---|---|---|
| *H01L 29/78* | (2006.01) | |
| *H01L 29/51* | (2006.01) | |
| *H01L 27/1159* | (2017.01) | |
| *G11C 11/22* | (2006.01) | |
| *H01L 29/66* | (2006.01) | |
| *H01L 21/02* | (2006.01) | |
| *H01L 21/28* | (2006.01) | |

(52) U.S. Cl.
CPC ...... *H01L 29/78391* (2014.09); *G11C 11/223* (2013.01); *G11C 11/2275* (2013.01); *H01L 27/1159* (2013.01); *H01L 29/513* (2013.01); *H01L 29/516* (2013.01); *H01L 29/517* (2013.01); *H01L 29/518* (2013.01); *H01L 21/0217* (2013.01); *H01L 21/0228* (2013.01); *H01L 21/02271* (2013.01); *H01L 29/40111* (2019.08); *H01L 29/6684* (2013.01)

(58) Field of Classification Search
CPC ............. H01L 29/78391; H01L 29/513; H01L 29/516; H01L 29/517; H01L 29/518; H01L 29/40111; H01L 29/6684; H01L 27/1159; H01L 21/0217; H01L 21/02271; H01L 21/0228; G11C 11/223; G11C 11/2275

See application file for complete search history.

(56) References Cited

U.S. PATENT DOCUMENTS

| | | | | |
|---|---|---|---|---|
| 2001/0011743 | A1* | 8/2001 | Arita ................. | H01L 29/40111 257/314 |
| 2006/0081901 | A1* | 4/2006 | Arimoto ................. | G11C 11/22 257/295 |

FOREIGN PATENT DOCUMENTS

| | | |
|---|---|---|
| KR | 100327483 B1 | 10/1999 |
| KR | 10-2001-0071697 A | 7/2001 |

* cited by examiner

*Primary Examiner* — Timor Karimy

(57) ABSTRACT

A ferroelectric semiconductor device of the present disclosure includes a substrate, a ferroelectric layer disposed on the substrate, an electric field control layer that is disposed on the ferroelectric layer and has a predetermined internal electric field formed without the application of an external electric power to alter the magnitude of a coercive electric field of the ferroelectric layer, and a gate electrode layer disposed on the electric field control layer.

20 Claims, 16 Drawing Sheets

FERROELECTRIC SEMICONDUCTOR DEVICE

CROSS-REFERENCE TO RELATED APPLICATION

The present application claims priority under 35 U.S.C. 119(a) to Korean Patent Application No. 10-2018-0072331, filed on Jun. 22, 2018, which is herein incorporated by reference in its entirety.

BACKGROUND

1. Technical Field

Various embodiments of the present disclosure generally relate to a semiconductor device, and more particularly, relate to a ferroelectric semiconductor device.

2. Related Art

Generally, a ferroelectric material refers to a material having spontaneous electrical polarization in a state in which no external electric field is applied. In addition, the ferroelectric material may exhibit a polarization hysteresis behavior when an external electric field is applied. The applied external electric field may be controlled so that the ferroelectric material has one of two stable remnant polarization states on a polarization hysteresis curve. Such characteristics can be utilized in memory devices to store logic information of "0" or "1" in a nonvolatile manner.

Recently, a field effect transistor type ferroelectric semiconductor device in which the ferroelectric material is used in a gate dielectric layer has been studied as a nonvolatile memory device. A write operation with respect to the nonvolatile memory device may be performed by applying a predetermined write voltage to a gate electrode layer and storing different states of remnant polarization in the gate dielectric layer as logic information. A read operation with respect to the nonvolatile memory device may be formed by reading an operation current passing through a channel layer of the field effect transistor. The resistance of the channel layer in the field effect transistor changes depending on different remnant polarization states stored in the gate dielectric layer.

SUMMARY

There is provided a ferroelectric semiconductor device according to an aspect of the present disclosure. The ferroelectric semiconductor device includes a substrate, a ferroelectric layer disposed on the substrate, an electric field control layer that is disposed on the ferroelectric layer and has a predetermined internal electric field formed without the application of an external electric power to control a magnitude of a coercive electric field of the ferroelectric layer, and a gate electrode layer disposed on the electric field control layer.

There is provided a ferroelectric semiconductor device according to another aspect of the present disclosure. The ferroelectric semiconductor device includes a substrate, a ferroelectric layer disposed on the substrate, an electric field control layer disposed on the ferroelectric layer, and a gate electrode layer disposed on the electric field control layer. The electric field control layer includes defect sites, having negative charges, distributed in an inner region adjacent to an interface with the gate electrode layer.

DETAILED DESCRIPTION

Figure 1:
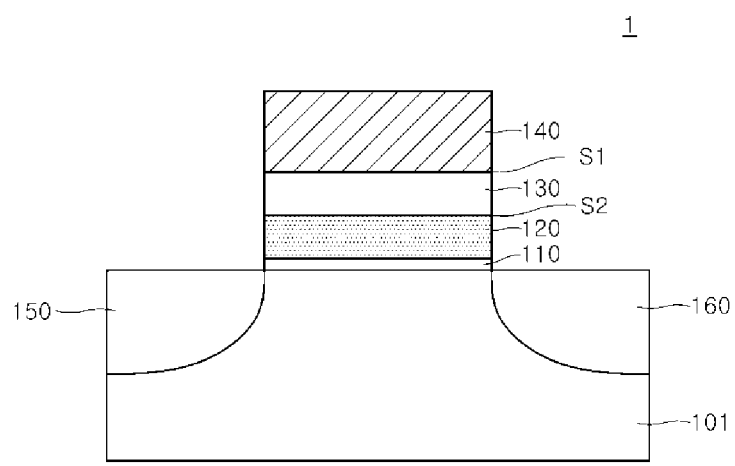
FIG. 1 is a cross-sectional view schematically illustrating a ferroelectric semiconductor device according to an embodiment of the present disclosure.

Various embodiments will now be described hereinafter with reference to the accompanying drawings. In the drawings, the dimensions of layers and regions may be exaggerated for clarity of illustration. The drawings are described with respect to an observer's viewpoint. If an element is referred to be located on another element, it may be understood that the element is directly located on the other element, or an additional element may be interposed between the element and the other element. The same reference numerals refer to the same elements throughout the specification.

In addition, expression of a singular form of a word should be understood to include the plural forms of the word unless clearly used otherwise in the context. It will be understood that the terms "comprise", "include" or "have" are intended to specify the presence of a feature, a number, a step, an operation, an element, a part, or combinations thereof, but not used to preclude the presence or possibility of addition one or more other features, numbers, steps, operations, components, parts, or combinations thereof. Further, in performing a method or a manufacturing method, each process constituting the method can take place differently from the stipulated order unless a specific sequence is described explicitly in the context. In other words, each process may be performed in the same manner as stated order, may be performed substantially at the same time, or may be performed in a reverse order.

Figure 2:
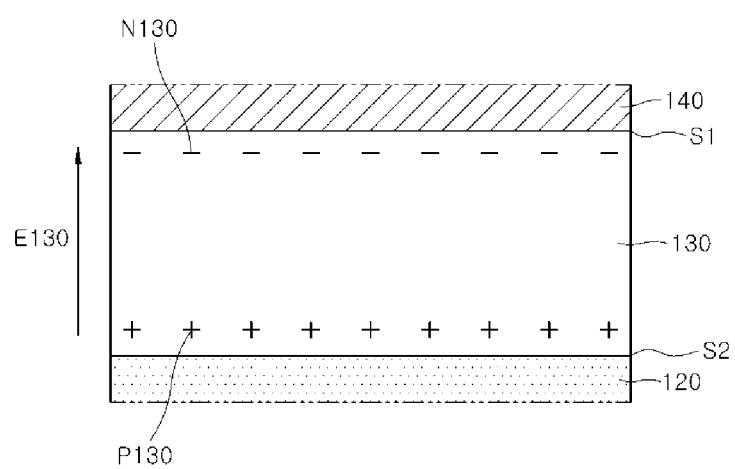
FIG. 2 is a schematic view illustrating an electric field control layer of a ferroelectric semiconductor device according to an embodiment of the present disclosure.
Figure 3:
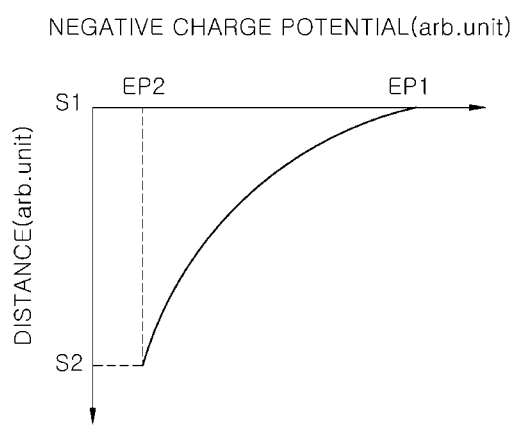
FIG. 3 is a graph illustrating the potential of negative charges in an electric field control layer according to an embodiment of the present disclosure.
Figure 4A:
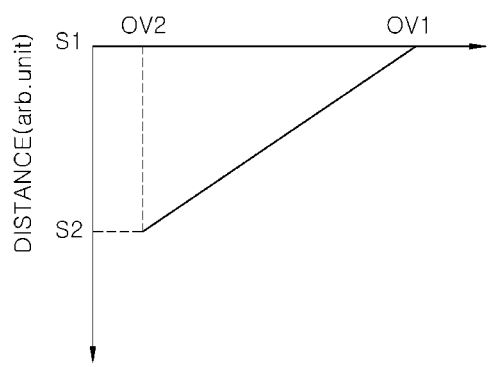
FIGS. 4A and 4B are graphs illustrating a concentration distribution of oxygen vacancies in an electric field control layer according to an embodiment of the present disclosure.
Figure 4B:
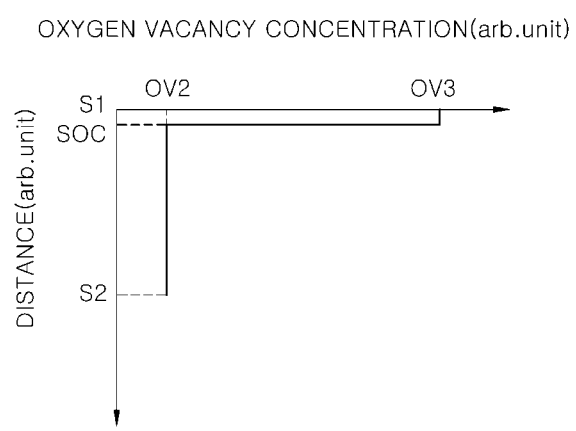
Figure 5A:
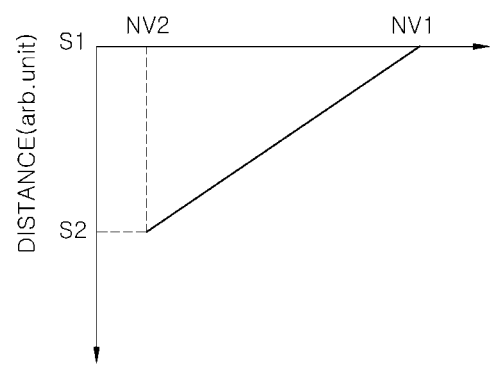
FIGS. 5A and 5B are graphs illustrating a concentration distribution of nitrogen vacancies in an electric field control layer according to an embodiment of the present disclosure.
Figure 5B:
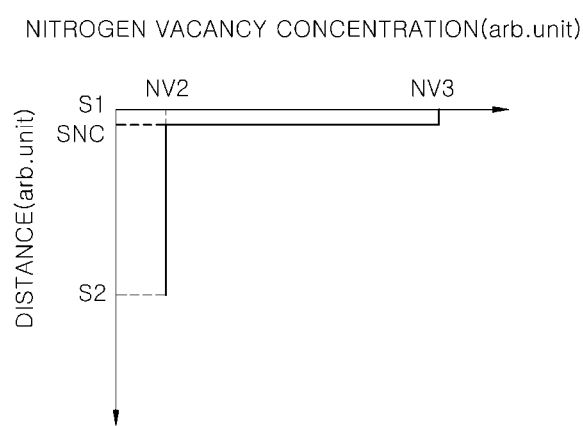
Figure 6A:
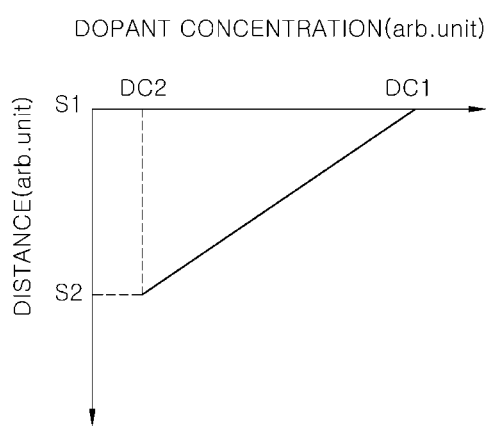
FIGS. 6A and 6B are graphs illustrating a concentration distribution of a dopant in the electric field control layer according to an embodiment of the present disclosure.
Figure 6B:
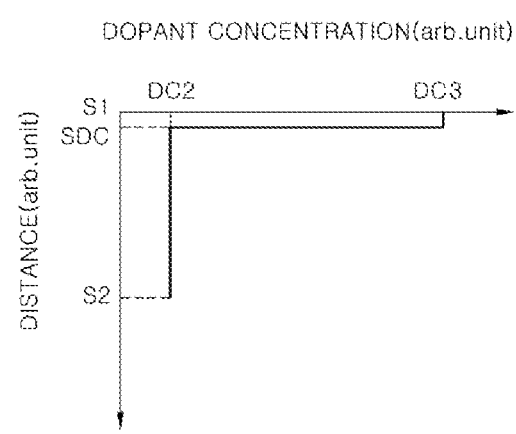

FIG. 1 is a cross-sectional view schematically illustrating a ferroelectric semiconductor device 1 according to an embodiment of the present disclosure. FIG. 2 is a schematic view illustrating an electric field control layer 130 of the ferroelectric semiconductor device 1 according to an embodiment of the present disclosure. FIG. 3 is a graph illustrating the potential of negative charges in the electric field control layer 130 according to an embodiment of the present disclosure. FIGS. 4A and 4B are graphs illustrating a concentration distribution of oxygen vacancies in the electric field control layer 130 according to an embodiment of the present disclosure. FIGS. 5A and 5B are graphs illustrating a concentration distribution of nitrogen vacancies in the electric field control layer 130 according to another embodiment of the present disclosure. FIGS. 6A and 6B are graphs illustrating a concentration distribution of a dopant in the electric field control layer 130 according to a further embodiment of the present disclosure.

Referring to FIG. 1, the ferroelectric semiconductor device 1 may include a substrate 101, a ferroelectric layer 120, an electric field control layer 130 and a gate electrode layer 140. The ferroelectric semiconductor device 1 may further include an interfacial insulation layer 110 between the substrate 101 and the ferroelectric layer 120. In addition, the ferroelectric semiconductor device 1 may further include a source region 150 and a drain region 160 disposed in the substrate 101 at both ends of the gate electrode layer 140. The ferroelectric semiconductor device 1 may be a memory device in which different signal information is stored in a nonvolatile manner according to the polarization orientation or polarization magnitude in the ferroelectric layer 120. In addition, the polarization orientation or polarization magnitude may be characterized by the magnitude of electrical resistance of the channel layer formed in the substrate 101 under the gate electrode layer 140.

Referring to FIG. 1, the substrate 101 may, for example, include a semiconductor material. The substrate 101 may, for example, be a silicon (Si) substrate, a gallium arsenide (GaAs) substrate, an indium phosphide (InP) substrate, a germanium (Ge) substrate, or a silicon germanium (SiGe) substrate. In an embodiment, the substrate 101 may be doped to have conductivity. As an example, the substrate 101 may be doped with a p-type dopant or an n-type dopant. As another example, the substrate 101 may include a well region doped with an n-type dopant or a p-type dopant.

An interfacial insulation layer 110 may be disposed on the substrate 101. The interfacial insulation layer 110 may be interposed between the substrate 101 and the ferroelectric layer 120. The interfacial insulation layer 110 may function to suppress the diffusion of materials between the substrate 101 and the ferroelectric layer 120 during the manufacturing of the ferroelectric semiconductor device 1. In addition, the interfacial insulation layer 110 may prevent direct contact of the substrate 101 and ferroelectric layer 120, which have different lattice constants. By including interfacial insulation layer 110, crystal defects generated due to lattice mismatch at an interface between the substrate 101 and the ferroelectric layer 120 can be prevented or limited. As the number or density of crystal defects increases at the interface in derogation of the ferroelectric layer 120, the reliability of the switching operation of the ferroelectric semiconductor device 1 may deteriorate, and its durability may deteriorate. Therefore, inserting interfacial insulation layer 110 between the substrate 101 and the ferroelectric layer 120 can improve the operation of ferroelectric semiconductor device 1.

In an embodiment, the interfacial insulation layer 110 may have an amorphous structure. The interfacial insulation layer 110 may, for example, include silicon oxide, silicon oxynitride, or aluminum oxide. As an example, when the substrate 101 is a silicon substrate, the interfacial insulation layer 110 may be a silicon oxide layer, or a silicon oxynitride layer. The interfacial insulation layer 110 may, for example, have a thickness of one nanometer (1 nm) or between zero (0) and two nanometers (2 nm), inclusive.

The ferroelectric layer 120 may be disposed on the interfacial insulation layer 110. The ferroelectric layer 120 may include a ferroelectric material having remnant polarization of predetermined orientation and predetermined magnitude in a state where no external voltage or external current is supplied. The ferroelectric layer 120 may have a thickness of about three nanometers (3 nm) to ten nanometers (10 nm), inclusive, for example.

In an embodiment, the ferroelectric layer 120 may include metal oxide. The ferroelectric layer 120 may, for example, include metal oxide having a crystal structure of an orthorhombic system. The ferroelectric layer 120 may, for example, include hafnium oxide, zirconium oxide, hafnium zirconium oxide, or a combination thereof. In an embodiment, the ferroelectric layer 120 may include at least one dopant. The dopant may, for example, include carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), gadolinium (Ga), lanthanum (La), or a combination of two or more thereof. In an embodiment, the dopant can stabilize the ferroelectric characteristics of the ferroelectric layer 120 by facilitating the maintenance of an orthorhombic crystal structure in the ferroelectric layer 120.

The electric field control layer 130 may be disposed on the ferroelectric layer 120. As illustrated in FIG. 2, a predetermined internal electric field E130 may be formed in the electric field control layer 130 in a state where no electric power is applied from outside. That is, the internal electric field E130 may exist and be maintained in the absence of an externally applied voltage or current, and may have predetermined size and direction. The internal electric field E130 may have an orientation in a direction from an inner region adjacent to the ferroelectric layer 120, i.e., adjacent to a second interface S2, towards an inner region adjacent to the gate electrode layer 140, i.e., adjacent to a first interface S1. In an example, the inner region adjacent to the first interface S1 may be charged with negative charges N130, and the inner region adjacent to the second interface S2 may be charged with positive charges P130.

In an embodiment, a potential of negative charges having a gradient, as illustrated in FIG. 3, may form in the electric field control layer 130 with the internal electric field E130 of FIG. 2. Referring to FIG. 3, the potential of the negative charges in the electric field control layer 130 may be lowered from the inner region adjacent to the first interface S1, to the inner region adjacent to the second interface S2. As an example, the potential of the negative charges has a first potential value EP1 at the first interface S1, and then may substantially continuously decrease until reaching the second interface S2 and a second potential value EP2.

Meanwhile, the internal electric field E130 formed in the electric field control layer 130 may affect the polarization switching operation with respect to the ferroelectric layer 120. As will be described later in connection with FIG. 8, the polarization hysteresis loop property of the ferroelectric layer 120 is affected or modified by the internal electric field E130.

The electric field control layer 130 may, for example, include insulative oxide or insulative nitride. The electric field control layer 130 may, for example, include silicon oxide, titanium oxide, aluminum oxide, nickel oxide, copper oxide, zirconium oxide, manganese oxide, hafnium oxide, tungsten oxide, tantalum oxide, niobium oxide, iron oxide, lanthanum oxide, silicon nitride, aluminum nitride, or a combination of two or more thereof. The electric field control layer 130 may, for example, have a thickness of two nanometers (2 nm) to ten nanometers (10 nm), inclusive.

In an embodiment, when the electric field control layer 130 includes insulative oxide, the electric field control layer 130 may have oxygen vacancies whose concentration and distribution are controlled to have predetermined values within the electric field control layer 130 as illustrated in FIGS. 4A and 4B. The oxygen vacancies within the electric field control layer 130 may generate trap sites capable of trapping electrons. The trap sites, in which the electrons are trapped, have negative electric charges that can generate the internal electric field E130 inside the electric field control layer 130 even if the electric field control layer 130 has insulative properties.

In an embodiment, as illustrated in FIGS. 4A and 4B, an oxygen vacancy concentration in an inner region of the electric field control layer 130, which is adjacent to or near the first interface S1, may be controlled or adjusted to be higher than the oxygen vacancy concentration in an inner region adjacent or proximate to the second interface S2. In an embodiment, as illustrated in FIG. 4A, the oxygen vacancies may have a concentration gradient along the thickness direction of the electric field control layer 130. As an example, the oxygen vacancy concentration having a first oxygen vacancy value OV1 at the first interface S1 may be substantially continuously decreased until the second interface S2, which has a second oxygen vacancy value OV2. As the oxygen vacancy concentration increases, the density of trap sites having negative charges may increase.

The electric field control layer 130 having a gradient of the oxygen vacancy concentration illustrated in FIG. 4A may have a potential of negative charges as illustrated in FIG. 3. In addition, the electric field control layer 130 may have an internal electric field having an orientation or direction as illustrated in FIG. 2. In an embodiment, the concentration gradient of oxygen vacancy illustrated in FIG. 4A may be implemented by controlling the composition of the electric field control layer 130 during manufacturing. As an example, when forming the electric field control layer 130 using a thin film containing an insulative oxide, the amount of oxygen injected into the thin film can be controlled. That is, when depositing the electric field control layer 130 on the interfacial insulation layer 110, the amount of the oxygen supplied as a source gas may be decreased according to process time. Accordingly, the oxygen supply amount is reduced or decreases toward the upper part, or interface S1, along the thickness direction of the electric field control layer 130, so that the concentration of oxygen vacancy in the electric field control layer 130 is increased in that region.

Meanwhile, the second oxygen vacancy value OV2 at the second interface S2 may correspond to a minimum amount of oxygen vacancy formed inside the electric field control layer 130 when using a sufficient or necessary amount of oxygen in the manufacturing process. The electric field control layer 130 may be formed, for example, using an atomic layer deposition method or a chemical vapor deposition method. As an example, when the electric field control layer 130 has a thickness of about two nanometers (2 nm) to ten nanometers (10 nm), inclusive, the ratio of the first oxygen vacancy value OV1 to the second oxygen vacancy value OV2 may be at least five to one (5:1), six to one (6:1), ten to one (10:1) or greater.

In another embodiment, as illustrated in FIG. 4B, oxygen vacancies may be concentrated in a region adjacent to or near the first interface S1, and the electric field control layer 130 may have a predetermined third oxygen vacancy value OV3 to a first depth SOC'. First depth SOC' represents a predetermined distance from the first interface S1. If the distance from the first interface S1 is greater than the first depth SOC, then the concentration of the oxygen vacancies in the electric field control layer 130 is reduced to the second oxygen vacancy value OV2, which is determined by the minimum amount of the oxygen vacancies consistent with the manufacturing process. As a result, high-density trap sites may be found concentrated in the region adjacent to the first interface S1 to first depth SOC'.

The electric field control layer 130 may have an internal electric field having an orientation or direction illustrated in FIG. 2. In an example, the first depth SOC may be about 1/10 to 1/2 of the thickness of the electric field control layer 130. As an example, the first depth SOC may be about one nanometer (1 nm) to two nanometers (2 nm). In an embodiment, when the electric field control layer 130 has a thickness of two nanometers (2 nm) to ten nanometers (10 nm), inclusive, the ratio of the third oxygen vacancy number OV3 to the second oxygen vacancy number OV2 may be at least five to one (5:1), six to one (6:1), ten to one (10:1) or greater.

In an embodiment, the concentration gradient of the oxygen vacancy illustrated in FIG. 4B may be implemented by rapidly reducing the oxygen supply amount when forming the upper region of the electric field control layer 130, which is proximate or adjacent to the first interface S1. Accordingly, the oxygen vacancy concentration of the electric field control layer 130 may rapidly increase as the oxygen in the region adjacent to the first interface S1 is correspondingly reduced.

In another embodiment, when the electric field control layer 130 includes insulative nitride, the electric field control layer 130 may include nitrogen vacancies whose concentration and distribution are controlled in the electric field control layer 130. As an example, the electric field control layer 130 may be a silicon nitride layer. The nitrogen vacancies therein can generate trap sites capable of trapping electrons in the electric field control layer 130. Negative charges in the trap sites, which trap electrons, contribute to the formation of the internal electric field E130, which may have properties consistent with an insulating layer.

As illustrated in FIGS. 5A and 5B, the nitrogen vacancy concentration in an inner region of the electric field control layer 130, close or adjacent to the first interface S1, may be higher than the nitrogen vacancy concentration of an inner region of the electric field control layer 130 adjacent to or near the second interface S2. In an embodiment, as illustrated in FIG. 5A, the nitrogen vacancy concentration having a first nitrogen vacancy value NV1 at the first interface S1 may substantially continuously decrease until reaching a second nitrogen concentration value NV2 at the second interface S2. In an embodiment, the second nitrogen concentration value NV2 at the second interface S2 may correspond to the minimum amount of nitrogen vacancies normally formed in the electric field control layer 130 during manufacturing processes.

The density of the trap sites having negative charges may increase as the concentration of the nitrogen vacancy increases. As an example, the electric field control layer 130, having the gradient of the nitrogen vacancy concentration shown in FIG. 5A, may have the potential of negative charge shown in FIG. 3. In addition, the electric field control layer 130 may have an internal electric field having an orientation or direction shown in FIG. 2. In an embodiment, when the electric field control layer 130 has a thickness of about two nanometers (2 nm) to ten nanometers (10 nm), inclusive, the ratio of the first nitrogen vacancy value NV1 to the second nitrogen vacancy value NV2 may be at least five to one (5:1), six to one (6:1), ten to one (10:1) or greater.

In another embodiment, as illustrated in FIG. 5B, the nitrogen vacancies may be concentrated on a region adjacent to the first interface S1, and the electric field control layer 130 may have a predetermined third nitrogen vacancy value NV3 to a first depth SNC, which represents a predetermined distance spaced from the first interface S1. In electric field control layer 130, when the distance from the first interface S1 is greater than the first depth SNC, the nitrogen vacancy concentration of the electric field control layer 130 in that region may have a second nitrogen vacancy value NV2. The second nitrogen vacancy value NV2 corresponds to the minimum amount of nitrogen vacancies generated during manufacturing. As a result, high-density trap sites may exist or concentrate in the region adjacent to the first interface S1 to a first depth SNC. The electric field control layer 130 may have an internal electric field having an orientation or direction shown in FIG. 2. As an example, the first depth SNC may be about 1/10 to 1/2 of the thickness of the electric field control layer 130. In some cases, the first depth SNC may be about one nanometer (1 nm) to two nanometers (2 nm), inclusive.

In an embodiment, the gradient of the nitrogen vacancy concentration illustrated in FIG. 5B may be implemented by rapidly reducing the amount of nitrogen provided when forming the upper region of the field control layer 130, adjacent to the first interface S1 to a predetermined depth. Accordingly, the nitrogen vacancy concentration of the electric field control layer 130 can correspond to the increase due to the deficiency of nitrogen in that region. In an embodiment, when the electric field control layer 130 has a thickness of two nanometers (2 nm) to ten nanometers (10 nm), inclusive, the ratio of the third nitrogen vacancy value NV3 to the second nitrogen vacancy value NV2 may be 5 to one (5:1), six to one (6:1), ten to one (10:1) or greater.

In yet another embodiment, in order to form an internal electric field E130 in the electric field control layer 130, a dopant may be implanted into the electric field control layer 130 to produce a concentration gradient. In an embodiment, the dopant may be implanted using an ion implantation method or a plasma treatment method. The dopant may generate defect sites having negative charges in the electric field control layer 130. The dopant may be an n-type dopant. In an embodiment, when the electric field control layer 130 includes silicon oxide or silicon nitride, the dopant may be an element having a greater number of valence electrons than silicon (Si). As an example, when the electric field control layer 130 includes silicon oxide or silicon nitride, the dopant may, for example, include phosphorus (P), arsenic (As) or antimony (Sb). The dopant may be substituted with the silicon (Si) of the silicon oxide or the silicon nitride to function as a defect site, with a negative charge, in the substituted state. In another embodiment, when the electric field control layer 130 includes an insulative metal oxide or insulative metal nitride, the dopant may be an element having a greater number of valence electrons than the metal of the metal oxide or the metal nitride. The dopant may be substituted with the metal in the electric field control layer 130 to function as a defect site, with a negative charge, in a substituted state.

As illustrated in FIGS. 6A and 6B, the dopant concentration in the inner region of the electric field control layer 130, which is proximate to or adjacent to the first interface S1, may be higher than the dopant concentration in the inner region of the layer adjacent to or near the second interface S2. In an embodiment, as illustrated in FIG. 6A, the dopant may have a concentration gradient along a thickness direction of the electric field control layer 130. As an example, the dopant concentration having a first dopant concentration value DC1 at the first interface S1 may substantially continuously decrease until reaching the second interface S2, with a second dopant concentration value DC2. The second dopant concentration value DC2 may be a lower limit value of the amount of dopant inevitably implanted in the region adjacent to the second interface S2 in the process of implanting the dopant to reach the first dopant concentration value DC1 adjacent to or near the first interface S1. As the dopant concentration increases, the density of the defect sites having negative charges may increase. The electric field control layer 130, having a gradient of dopant concentration illustrated in FIG. 6A, may have the distribution of the electron potential illustrated in FIG. 3. In addition, the electric field control layer 130 may have an internal electric field having an orientation or direction illustrated in FIG. 2.

In another embodiment, as illustrated in FIG. 6B, the dopant may be concentrated in a region close or adjacent to the first interface S1. That is, the electric field control layer 130 may have a third dopant concentration value DC3, from first interface S1 to the first depth SDC, which is a predetermined distance from the first interface S1. When the distance from the first interface S1 increases beyond the first depth SDC, the dopant concentration of the remainder of the electric field control layer 130 may maintain the second dopant concentration DC2, which corresponds to the least dopant concentration in the electric field control layer 130 resulting from the manufacturing process. As a result, high-density defect sites may exist in the region adjacent to the first interface S1 to first depth SDC. The electric field control layer 130 may have an internal electric field having an orientation or direction illustrated in FIG. 2. As an example, the first depth SDC may be about 1/10 to 1/2 of the thickness of the electric field control layer 130.

Meanwhile, referring back to FIG. 1, the gate electrode layer 140 may be disposed on the electric field control layer 130. The gate electrode layer 140 may include a conductive material. The conductive material may, for example, include tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

The source region 150 and the drain region 160 may be disposed in the substrate 101 at both ends of the gate electrode layer 140. The source region 150 and the drain region 160 may be regions of the substrate 101, which are doped with different types of dopants from the substrate 101. As an example, when the substrate 101 is doped into p-type, the source region 150 and the drain region 160 may be doped into n-type. As another example, when the substrate 101 is doped into n-type, the source region 150 and the drain region 160 may be doped into p-type.

Figure 7:
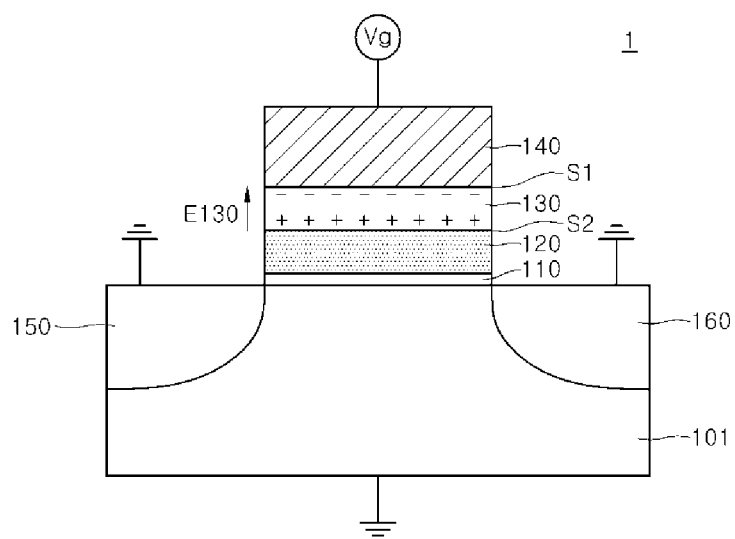
FIG. 7 is a view illustrating a write operation of a ferroelectric semiconductor device according to an embodiment of the present disclosure.
Figure 8:
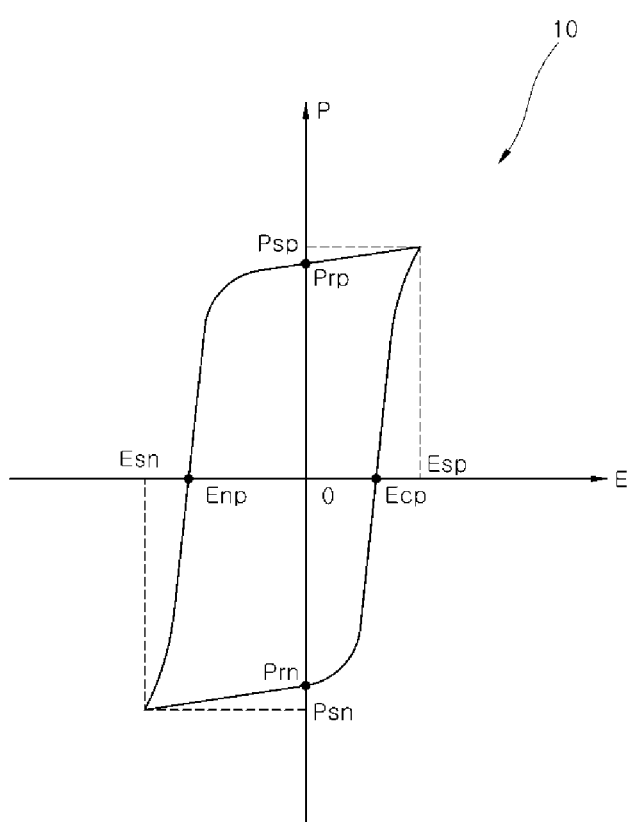
FIG. 8 is a graph schematically illustrating an electric field-polarization hysteresis loop of a ferroelectric layer in a ferroelectric semiconductor device according to an embodiment of the present disclosure.
Figure 9:
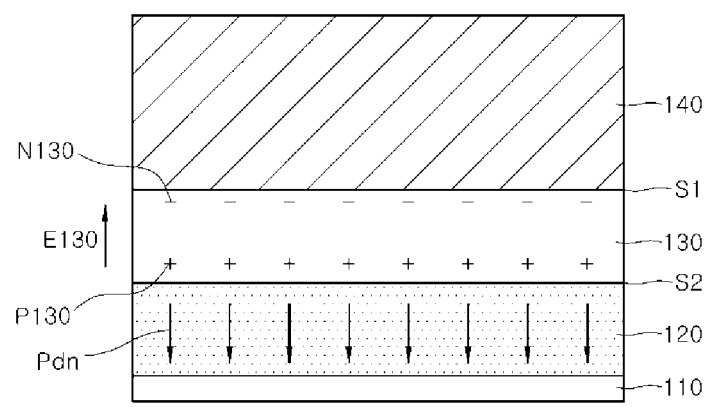
FIGS. 9 and 10 are views respectively illustrating remnant polarization stored in ferroelectric layers of ferroelectric semiconductor devices according to embodiments of the present disclosure.
Figure 11:
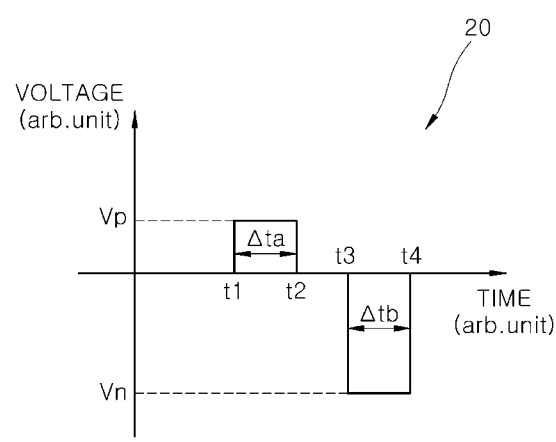
FIG. 11 is a view schematically illustrating an input pulse of a write voltage provided to a ferroelectric semiconductor device in an embodiment of the present disclosure.

FIG. 7 is a view illustrating a write operation of a ferroelectric semiconductor device 1 according to an embodiment of the present disclosure. FIG. 8 is a graph schematically illustrating a field-polarization hysteresis loop of a ferroelectric layer 120 affected by an electric field control layer 130 in the ferroelectric semiconductor device 1 according to an embodiment of the present disclosure. FIG. 9 and are views illustrating remnant polarization stored in the ferroelectric layer 120 of the ferroelectric semiconductor device 1 according to embodiments of the present disclosure. FIG. 11 is a view schematically illustrating an input pulse 20 of a write voltage provided to the ferroelectric semiconductor device 1 in an embodiment of the present disclosure.

Referring to FIG. 7, the ferroelectric semiconductor device 1 described above and with reference to FIGS. 1 to 6B may be prepared. As illustrated in FIG. 7, the electric field control layer 130 may have an internal electric field E130 of a predetermined magnitude and a predetermined direction. The internal electric field E130 may have an orientation or direction from the second interface S2 to the first interface S1.

As illustrated in FIG. 7, a substrate 101, a source region 150, and a drain region 160 of the ferroelectric semiconductor device 1 may be grounded and a gate voltage Vg having positive bias and a gate voltage Vg having a negative bias may be sequentially applied to a gate electrode 140 to form polarization having predetermined magnitude and orientation in the ferroelectric layer 120. FIG. 8 illustrates a hysteresis loop 10 illustrating the variation of the polarization formed in the ferroelectric layer 120, under the influence of the remnant polarization in the electric field control layer 130, when the gate voltage Vg is applied. Specifically, in FIG. 8, the polarization of the ferroelectric layer 120 varies according to the magnitude of the operation electric field E. The operation electric field E may be defined as a value obtained by dividing the applied gate voltage Vg by the thickness of the ferroelectric layer 120.

Referring to FIG. 8, the hysteresis loop 10 may have a first coercive electric field Ecp, a second coercive electric field Enp, first remnant polarization Prp and second remnant polarization Prn. The first and second coercive electric fields Ecp and Enp are electric fields of the minimum or threshold magnitudes that can switch the orientation of the polarization stored in the ferroelectric layer 120 when the operation electric field E is applied to the ferroelectric layer 120. As an example, when the ferroelectric layer 120 has the first remnant polarization Prp, the polarization orientation in the ferroelectric layer 120 may be switched to an opposite direction when a negative electric field having a magnitude equal to or greater than the absolute value of the second coercive electric field Enp is applied through the gate electrode layer 140. As another example, when the ferroelectric layer 120 has the second remnant polarization Prn, the polarization orientation in the ferroelectric layer 120 may be switched to an opposite direction when a positive electric field having a magnitude equal to or greater than the first coercive electric field Ecp is applied through gate electrode layer 140.

The first and second remnant polarization Prp and Prn may mean the maximum polarization, in each direction, that the ferroelectric layer 120 can maintain in a state where the gate voltage Vg is not applied. The first and second remnant polarization Prp and Prn may be formed in the ferroelectric layer 120 by applying a gate voltage Vg of positive polarity or a negative polarity corresponding to a magnitude equal to or greater than the absolute value of the first and second saturation electric fields Esp and Esn, respectively, to the gate electrode layer 140 and then removing that gate voltage Vg. That is, the first and second saturation electric fields Esp and Esn may mean the minimum or threshold operation electric field applied through the gate electrode layer 140 in order to obtain the first and second remnant polarization Prp and Prn, respectively.

The polarization hysteresis loop of FIG. 8 illustrates the first and second saturation polarization Psp and Psn as the maximum polarization that the ferroelectric layer 120 can have, when the gate voltage Vg of a positive polarity or a negative polarity, respectively corresponding to the magnitude of the absolute value of the first and second saturation electric fields Esp and Esn, is applied to the gate electrode layer 140.

Referring to FIG. 8, the magnitudes of the first remnant polarization Prp and the second remnant polarization Prn may be substantially the same. On the other hand, the absolute value of the first coercive electric field Ecp may be smaller than the absolute value of the second coercive electric field Enp. In addition, the absolute value of the first saturation electric field Esp applied to obtain the first remnant polarization Prp may be smaller than the absolute value of the second saturation electric field Esn applied to obtain the second remnant polarization Prn. In embodiments of the present disclosure, the internal electric field of the electric field control layer 130 affects the hysteresis loop characteristic of the ferroelectric layer 120, thereby changing the magnitude of a pair of coercive electric fields that would otherwise have substantially the same absolute value. As a result, the first and second coercive electric fields Ecp and Enp may be changed or altered to different absolute values by the effect of the internal electric field of the electric field control layer 130 on the magnitude and orientation of the remnant polarization in ferroelectric layer 120, as described above.

Figure 10:
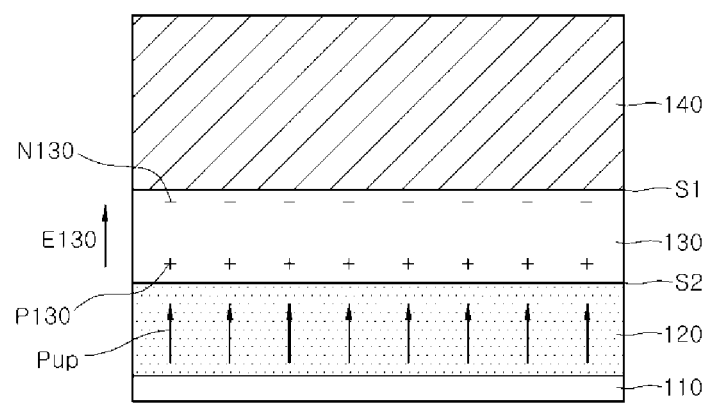

FIG. 9 schematically illustrates the polarization orientation of the ferroelectric layer 120, having first remnant polarization Prp as illustrated in FIG. 8, according to an embodiment. FIG. 10 schematically illustrates the polarization orientation of the ferroelectric layer 120, with a second remnant polarization Prn as illustrated in FIG. 8, according to an embodiment.

As described above, regardless of the application of the gate voltage Vg, the electric field control layer 130 has an internal electric field E130 having predetermined magnitude and predetermined orientation. The inner region of the electric field control layer 130, which is adjacent to the first interface S1, can have negative electric charges N130, and an inner region of the electric field control layer 130, which is adjacent to the second interface S2, can have positive electric charges P130. The positive charges P130 may produce an electric field inside the ferroelectric layer 120, which affects polarization switching.

In an embodiment, when a gate voltage Vg having a positive bias is applied to the gate electrode layer 140, the polarization of the ferroelectric layer 120 may be aligned in the first polarization orientation Pdn. The electric field formed by the positive charges P130 in the electric field control layer 130 augment the polarization of the ferroelectric layer 120 to align in the first polarization orientation Pdn. As an example, when the ferroelectric layer 120 has the second remnant polarization Prn corresponding to the second polarization orientation Pup, the electric field formed by the positive electric charges P130 can help switch the polarization of the ferroelectric layer 120 from the second polarization orientation Pup to the first polarization orientation Pdn in accordance with the gate voltage Vg. Referring to FIG. 9, the gate voltage Vg for forming the first remnant polarization having the first polarization orientation Pdn in the ferroelectric layer 120 may be a voltage corresponding to the first saturation electric field Esp of FIG. 8.

In another embodiment, when a gate voltage Vg having a negative bias is applied to the gate electrode layer 140, the polarization of the ferroelectric layer 120 may be aligned in the second polarization orientation Pup. The electric field formed by the positive charges P130 in the electric field control layer 130 may prevent or inhibit the polarization of the ferroelectric layer 120 from aligning with the second polarization orientation Pup. As an example, when the ferroelectric layer 120 has the first remnant polarization Prp of the first polarization orientation Pdn, the electric field formed by the positive charges P130 may prevent or inhibit the polarization of the ferroelectric layer 120 from being switched from the first polarization orientation Pdn to the second polarization orientation Pup by the gate voltage Vg. Referring to FIG. 10, the gate voltage Vg for forming the second remnant polarization Prn having the second polarization orientation Pup in the ferroelectric layer 120 may be a voltage corresponding to the second saturation electric field Esn of FIG. 8.

Consequently, the electric field control layer 130 having the internal electric field E130 is interposed between the ferroelectric layer 120 and the gate electrode layer 140, so that the absolute value of the first coercive electric field Ecp of the ferroelectric layer 130 can be decreased to be less than the absolute value of the second coercive electric field Enp. In addition, the absolute value of the first saturation electric field Esp can be decreased to be less than the absolute value of the second saturation electric field Esn. Accordingly, the absolute value of the gate voltage Vg used to form the first remnant polarization Prp in the ferroelectric layer 120, can be controlled or changed to be substantially smaller than the absolute value of the gate voltage Vg that is used to form the second remnant polarization Prn in the ferroelectric layer 120.

FIG. 11 schematically illustrates a pulse signal 20 of a gate voltage Vg provided for a write operation of the ferroelectric semiconductor device 1, in an embodiment of the present disclosure. Referring to FIG. 11, remnant polarization Prp having the first polarization orientation Pdn may be formed in the ferroelectric layer 120 by applying a first write voltage Vp having a predetermined positive polarity and then removing the first write voltage Vp, during a first time interval Δta from a first time t1 to a second time t2. In addition, remnant polarization Prn having the second polarization orientation Pup may be formed in the ferroelectric layer 120 by applying a second write voltage Vn having a predetermined negative polarity and then removing the second write voltage Vn, during a second time interval Δtb from a third time t3 to a fourth time t4. The magnitude of the first write voltage Vp may be smaller than the absolute magnitude of the second write voltage Vn. The magnitude of the first time interval Δta and the magnitude of the second time interval Δtb may be substantially the same.

According to the embodiments described above and with reference to FIGS. 1 to 3, and FIGS. 7 to 11, the polarization retention or durability of the switching operation of the ferroelectric semiconductor device can be improved. In an embodiment, referring to FIG. 1, the interfacial insulation layer 110 may be included between the substrate 101 and the ferroelectric layer 120. Since the interfacial insulation layer 110 is formed in a thickness of zero and two nanometers (2 nm), inclusive, when the gate voltage Vg of about three voltages (3 V) to four voltages (4 V) is applied to the gate electrode layer 140 in the form of a bias having a positive polarity, the interfacial insulation layer 110 or the ferroelectric layer 120 may be electrically damaged.

In an embodiment, the chemical bonds of the oxide or nitride in the interfacial insulation layer 110 or in the ferroelectric layer 120 may be broken by the bias with positive polarity, so that oxygen vacancies or nitrogen vacancies may be formed. When the oxygen vacancies or the nitrogen vacancies are concentrated at or near an interface between the interfacial insulation layer 110 and the ferroelectric layer 120, the oxygen vacancies or the nitrogen vacancies may act as defect sites in derogation of the polarization retention properties or durability of the ferroelectric layer 120. On the other hand, when the gate voltage Vg is applied to the gate electrode layer 140 in the form of a bias having a negative polarity, the interfacial insulation layer 110 or the ferroelectric layer 120 can receive relatively less electrical damage, as compared with a case where the gate voltage Vg is applied in the form of a bias having positive polarity. This is because the bias having a negative polarity is less effective than breaking the chemical bonds of the oxide or nitride in the interfacial dielectric layer 110 or in the ferroelectric layer 120.

According to embodiments of the present disclosure, when the write operation with respect to the ferroelectric layer 120 proceeds, the predetermined internal electric field E130 in the electric field control layer 130 can reduce the magnitude of the write voltage with a positive polarity that must be applied to the gate electrode layer 140. Accordingly, the electrical damage of the interfacial insulation layer 110 or the ferroelectric layer 120 due to the write voltage with positive bias can be reduced, because the density of oxygen vacancy or nitrogen vacancy formed in the interfacial insulation layer 110 and the ferroelectric layer 120 is reduced. In addition, the density of the defect sites formed at the interface between the interfacial insulation layer 110 and the ferroelectric layer 120 may also be reduced. In comparison, the magnitude of a bias having a negative polarity applied to the gate electrode layer 140 during a writing operation may be relatively greater in magnitude, but a bias with a negative polarity has a smaller effect on the generation of the vacancies and defect sites. Consequently, the polarization retention or durability of the ferroelectric semiconductor device 1 can be effectively improved without deteriorating the reliability of the polarization switching operation of the ferroelectric semiconductor device 1.

Figure 12:
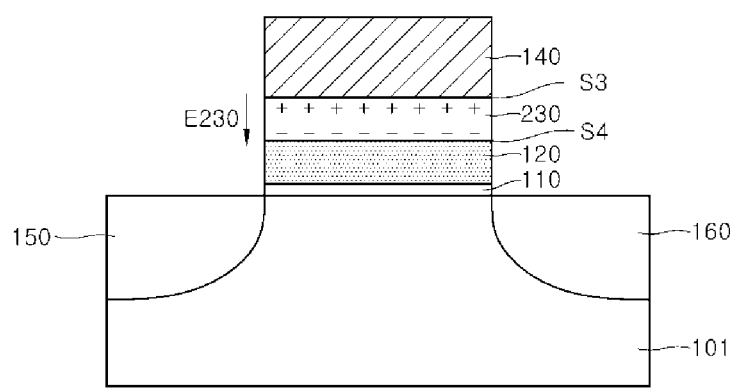
FIG. 12 is a cross-sectional view schematically illustrating a ferroelectric semiconductor device according to another embodiment of the present disclosure.
Figure 13:
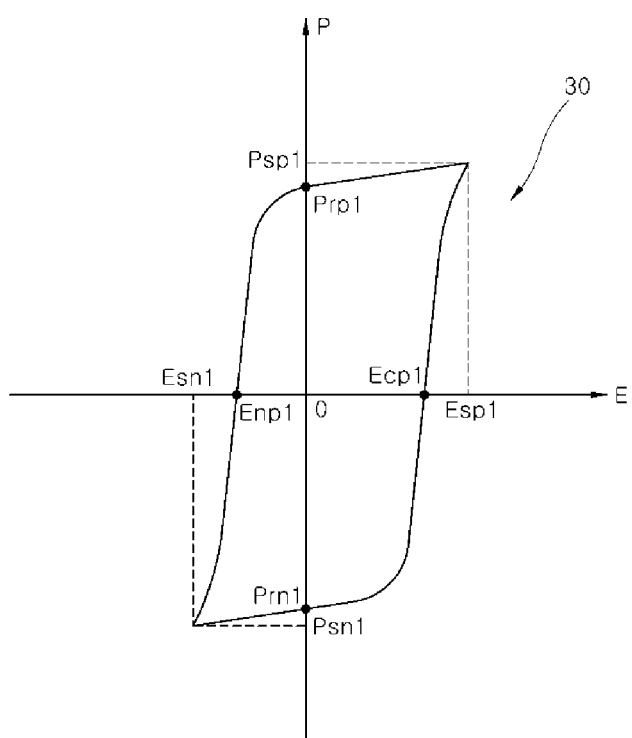
FIG. 13 is a graph schematically illustrating an electric field-polarization hysteresis loop of a ferroelectric layer in the ferroelectric semiconductor device of FIG. 12.

FIG. 12 is a cross-sectional view schematically illustrating a ferroelectric semiconductor device 2 according to another embodiment of the present disclosure. FIG. 13 is a graph schematically illustrating an electric field-polarization hysteresis loop 30 of a ferroelectric layer 120 in the ferroelectric semiconductor device 2 of FIG. 12.

Referring to FIG. 12, a configuration of the ferroelectric semiconductor device 2 may be substantially the same as that of the ferroelectric semiconductor device 1 illustrated in FIG. 1, except that a direction of an internal electric field E230 of an electric field control layer 230 is opposite to that of the internal electric field E130 of the electric field control layer 130 of the ferroelectric semiconductor device 1 of FIG. 1.

The internal electric field E230 of the electric field control layer 230 can be obtained by controlling a concentration gradient of oxygen vacancy, a concentration gradient of nitrogen vacancy, or a concentration gradient of a dopant in the electric field control layer 230. Specifically, a concentration gradient of an opposite direction to the concentration gradient of the oxygen vacancy, the nitrogen vacancy, or the dopant illustrated in FIG. 4A, 4B, 5A, 5B, 6A or 6B can be formed in the electric field control layer 230. As an example, the concentration of the oxygen vacancy in an inner region of the electric field control layer 230, which is adjacent to the ferroelectric layer 120, that is, proximate or adjacent to a second interface S4 may be higher than the concentration of the oxygen vacancy in an inner region adjacent to the gate electrode layer 140, that is, adjacent or close to a first interface S3. As another example, in the electric field control layer 230, the dopant concentration in the inner region adjacent to the second interface S4 may be higher than the dopant concentration in the inner region adjacent to the first interface S3.

Referring to the electric field-polarization hysteresis loop 30 of FIG. 13, the absolute magnitudes of first remnant polarization Prp1 and second remnant polarization Prn1 may be substantially the same. However, the absolute value of the first coercive electric field Ecp1 may be greater than the absolute value of the second coercive electric field Enp1. In addition, the absolute value of a first saturation electric field Esp1 for obtaining a first remnant polarization Prp1 may be greater than the absolute value of a second saturation electric field Esn1 for establishing the second remnant polarization Prn1. Referring to FIG. 12 and FIG. 13, when a first write operation proceeds, the predetermined internal electric field E230 formed in the electric field control layer 230 may require an increase in the magnitude of a bias having a positive polarity, which is applied to the gate electrode layer 140 as a first write voltage. The first write voltage may be a voltage writing the first remnant polarization Prp1 having the first polarization orientation Pdn in the ferroelectric layer 120. In contrast, when a second write operation with respect to the ferroelectric layer 120 proceeds, the predetermined internal electric field E230 formed in the electric field control layer 230 may decrease the absolute magnitude of a bias having a negative polarity, which is applied to the second gate electrode layer 140 as a second write voltage. The second write voltage may be a voltage that writes the second remnant polarization Prn1 with the second polarization orientation Pup in the ferroelectric layer 120. As described above, according to the present embodiment, when writing the first and second remnant polarization Prp1 and Prn1 in the ferroelectric layer 120, the magnitude of the bias applied to the gate electrode layer 140 can be differentiated due to the internal electric field E230 formed in the electric field control layer 230. That is, the absolute values of the first saturation electric field Esp1 and the first coercive electric field Ecp1 are greater than the absolute values of the corresponding second saturation electric field Esn1 and the second coercive electric field Enp1.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A ferroelectric semiconductor device comprising:
   a substrate;
   a ferroelectric layer disposed on the substrate;
   an electric field control layer disposed on the ferroelectric layer and comprising a plurality of oxygen vacancies; and
   a gate electrode layer disposed on the electric field control layer,
   wherein the electric field control layer is configured to have an internal electric field that controls a magnitude of a coercive electric field of the ferroelectric layer, and
   wherein a first oxygen vacancy concentration decreases from a first interface of the electric control layer with the gate electrode layer to a second oxygen vacancy concentration at a second interface of the electric control layer with the ferroelectric layer.

2. The ferroelectric semiconductor device of claim 1, wherein the ferroelectric layer comprises at least one selected from the group consisting of hafnium oxide, zirconium oxide, and hafnium zirconium oxide.

3. The ferroelectric semiconductor device of claim 1, wherein the electric field control layer comprises insulative oxide or insulative nitride.

4. The ferroelectric semiconductor device of claim 1, wherein the electric field control layer comprises a dopant having a concentration gradient.

5. The ferroelectric semiconductor device of claim 4, wherein the ferroelectric layer comprises at least one selected from the group consisting of carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), gadolinium (Ga), and lanthanum (La) as a dopant.

6. The ferroelectric semiconductor device of claim 1, wherein the internal electric field is formed such that a potential of a negative electric charge decreases from a first interface of the electric field control layer with the gate electrode layer to a second interface with the ferroelectric layer.

7. The ferroelectric semiconductor device of claim 1, wherein the electric field control layer comprises at least one selected from the group consisting of silicon oxide, titanium oxide, aluminum oxide, nickel oxide, copper oxide, zirconium oxide, manganese oxide, hafnium oxide, tungsten oxide, tantalum oxide, niobium oxide, iron oxide, lanthanum oxide, silicon nitride, and aluminum nitride.

8. The ferroelectric semiconductor device of claim 1, wherein the electric field control layer comprises a dopant, and
   wherein a dopant concentration decreases from a first interface of the electric control layer with the gate electrode layer to a second interface of the electric control layer with the ferroelectric layer.

9. The ferroelectric semiconductor device of claim 1, wherein the gate electrode layer comprises at least one selected from the group consisting of tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, and ruthenium oxide.

10. The ferroelectric semiconductor device of claim 1, wherein the electric field control layer changes the magnitude of the coercive electric field required to form a second remanent polarization magnitude in the ferroelectric layer.

11. A ferroelectric semiconductor device comprising:
    a substrate;
    a ferroelectric layer disposed on the substrate;
    an electric field control layer disposed on the ferroelectric layer and comprising a plurality of nitrogen vacancies; and a gate electrode layer disposed on the electric field control layer, wherein the electric field control layer is configured to have an internal electric field that controls a magnitude of a coercive electric field of the ferroelectric layer, and wherein a first nitrogen vacancy concentration decreases from a first interface of the electric control layer with the gate electrode layer to a second nitrogen vacancy concentration at a second interface of the electric control layer with the ferroelectric layer.

12. The ferroelectric semiconductor device of claim 11, wherein the ferroelectric layer comprises at least one selected from the group consisting of hafnium oxide, zirconium oxide, and hafnium zirconium oxide.

13. The ferroelectric semiconductor device of claim 11, wherein the electric field control layer comprises insulative oxide or insulative nitride.

14. The ferroelectric semiconductor device of claim 11, wherein the electric field control layer comprises a dopant having a concentration gradient.

15. The ferroelectric semiconductor device of claim 14, wherein the ferroelectric layer comprises at least one selected from the group consisting of carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), gadolinium (Ga), and lanthanum (La) as a dopant.

16. The ferroelectric semiconductor device of claim 11, wherein the internal electric field is formed such that a potential of a negative electric charge decreases from a first interface of the electric field control layer with the gate electrode layer to a second interface with the ferroelectric layer.

17. The ferroelectric semiconductor device of claim 11, wherein the electric field control layer comprises at least one selected from the group consisting of silicon oxide, titanium oxide, aluminum oxide, nickel oxide, copper oxide, zirconium oxide, manganese oxide, hafnium oxide, tungsten oxide, tantalum oxide, niobium oxide, iron oxide, lanthanum oxide, silicon nitride, and aluminum nitride.

18. The ferroelectric semiconductor device of claim 11, wherein the electric field control layer comprises a dopant, and wherein a dopant concentration decreases from a first interface of the electric control layer with the gate electrode layer to a second interface of the electric control layer with the ferroelectric layer.

19. The ferroelectric semiconductor device of claim 11, wherein the gate electrode layer comprises at least one selected from the group consisting of tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, and ruthenium oxide.

20. The ferroelectric semiconductor device of claim 11, wherein the electric field control layer lowers the magnitude of the coercive electric field required to form a second remanent polarization magnitude in the ferroelectric layer.

* * * * *